United States Patent
Lee

(10) Patent No.: US 8,180,500 B2
(45) Date of Patent: May 15, 2012

(54) TEMPERATURE SENSING SYSTEM AND RELATED TEMPERATURE SENSING METHOD

(75) Inventor: Wen-Ming Lee, Miaoli County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 233 days.

(21) Appl. No.: 12/512,019

(22) Filed: Jul. 29, 2009

(65) Prior Publication Data

US 2011/0029272 A1    Feb. 3, 2011

(51) Int. Cl.
| G05B 15/00 | (2006.01) |
| G05B 11/01 | (2006.01) |
| G05D 23/00 | (2006.01) |
| G06F 13/00 | (2006.01) |
| G06F 13/28 | (2006.01) |
| G11C 7/04  | (2006.01) |
| G11C 7/00  | (2006.01) |
| G11C 5/14  | (2006.01) |
| G11C 11/34 | (2006.01) |

(52) U.S. Cl. .............. 700/299; 700/1; 700/17; 365/211; 365/212; 365/222; 365/226; 365/227; 711/106

(58) Field of Classification Search .................. 711/106; 365/222, 211–212, 226–227; 700/1, 17, 700/299

See application file for complete search history.

(56) References Cited

U.S. PATENT DOCUMENTS

| 5,278,796 | A  * | 1/1994  | Tillinghast et al. |          |
|-----------|------|---------|--------------------|----------|
| 6,411,157 | B1 * | 6/2002  | Hsu et al.         |          |
| 6,735,726 | B2 * | 5/2004  | Muranaka et al.    | 714/708  |
| 7,079,735 | B2 * | 7/2006  | Abbott et al.      | 385/123  |
| 7,082,070 | B2 * | 7/2006  | Hong               |          |
| 7,292,491 | B2 * | 11/2007 | Sinha et al.       | 365/222  |
| 7,413,342 | B2 * | 8/2008  | Mukherjee          |          |
| 7,640,392 | B2 * | 12/2009 | Walker             |          |
| 2004/0264288 | A1 * | 12/2004 | Sunaga et al.    |          |
| 2005/0036380 | A1 * | 2/2005  | Su               | 365/222  |
| 2006/0023545 | A1 * | 2/2006  | Ito et al.       |          |
| 2006/0083094 | A1 * | 4/2006  | Sinha et al.     | 365/222  |
| 2006/0159156 | A1 * | 7/2006  | Lee et al.       | 374/183  |
| 2006/0203589 | A1 * | 9/2006  | Lee              |          |
| 2006/0221756 | A1 * | 10/2006 | Miura et al.     |          |
| 2006/0294294 | A1 * | 12/2006 | Walker           |          |
| 2007/0203664 | A1 * | 8/2007  | Ishikawa         | 702/130  |
| 2007/0253271 | A1 * | 11/2007 | Ito et al.       |          |
| 2007/0274147 | A1 * | 11/2007 | Egerer           | 365/222  |
| 2008/0025120 | A1 * | 1/2008  | Heilmann et al.  | 365/211  |
| 2008/0089138 | A1 * | 4/2008  | Wolford et al.   |          |
| 2008/0320323 | A1 * | 12/2008 | Brittain et al.  |          |
| 2009/0122631 | A1 * | 5/2009  | Pyeon            | 365/222  |
| 2009/0238020 | A1 * | 9/2009  | Mayer et al.     | 365/222  |
| 2010/0142304 | A1 * | 6/2010  | Pyeon            | 365/222  |
| 2010/0195412 | A1 * | 8/2010  | Furutani et al.  | 365/189.05 |
| 2011/0208471 | A1 * | 8/2011  | Lee et al.       | 702/124  |

* cited by examiner

*Primary Examiner* — Ronald Hartman, Jr.

(74) *Attorney, Agent, or Firm* — Winston Hsu; Scott Margo

(57) ABSTRACT

A temperature sensing system, which comprises: a temperature analyzing circuit, for sensing temperature and generating an analyzing result in response to the sensed temperature; and a control unit, for controlling a temperature sensing time interval; wherein the control unit continuously changes the temperature sensing time interval according to a predetermined temperature range in response to the sensed temperature.

16 Claims, 4 Drawing Sheets

TEMPERATURE SENSING SYSTEM AND RELATED TEMPERATURE SENSING METHOD

BACKGROUND OF THE INVENTION

1. Field of the Invention

The present invention relates to a temperature sensing system and related temperature sensing method, and particularly relates to a temperature sensing system that can change temperature sensing time intervals between each of temperature sensing operations and related temperature sensing method.

2. Description of the Prior Art

In an electronic device, temperature sensing operation is necessary because some problems may occur if the electronic characteristic variation due to temperature difference is not well compensated. For example, the charge in the DRAM cell will leak in a shorter time when the temperature is higher. Thus, a temperature dependent refresh command is necessary in order to maintain with lower current consumption. Also, a refresh command can be triggered base on the chip temperature which is provided by on die temperature sensor. A temperature sensor also consumes current, thus it should consume current as less as possible.

Please refer to FIG. 1, which discloses a schematic diagram of a prior art temperature sensing method. As shown in FIG. 1, the sampling preparing signal SPS is utilized to determine the time interval between each sampling (i.e. determine the temperature sensing time interval between each temperature sensing operation). The comparator enabling signal CES is utilized to enable a comparator, which compares a reference voltage and a voltage associated with temperature. The comparing result signal CRS indicates the comparing result from the comparator. Temperature sensing operations will be performed continuously. The temperature sensing time interval between each temperature sensing operation is fixed in the prior art, but in some situation the temperature sensing operations do not need to be performed so frequently.

SUMMARY OF THE INVENTION

One embodiment of the present invention discloses a temperature sensing system, which comprises: a temperature analyzing circuit, for sensing temperature and generating an analyzing result in response to the sensed temperature; and a control unit, for controlling a temperature sensing time interval; wherein the control unit continuously changes the temperature sensing time interval according to a predetermined temperature range in response to the sensed temperature.

Another embodiment of the present invention discloses a temperature sensing method, which comprises: (a) utilizing a temperature analyzing circuit to sense temperature and to generate an analyzing result in response to the sensed temperature; and (b) utilizing a control unit to control a temperature sensing time interval; wherein the step (b) continuously changes the temperature sensing time interval according to a predetermined temperature range in response to the sensed temperature.

According to above mentioned description, the unnecessary temperature sensing operations can be avoided, such that the power consumption of the temperature sensor can decrease.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
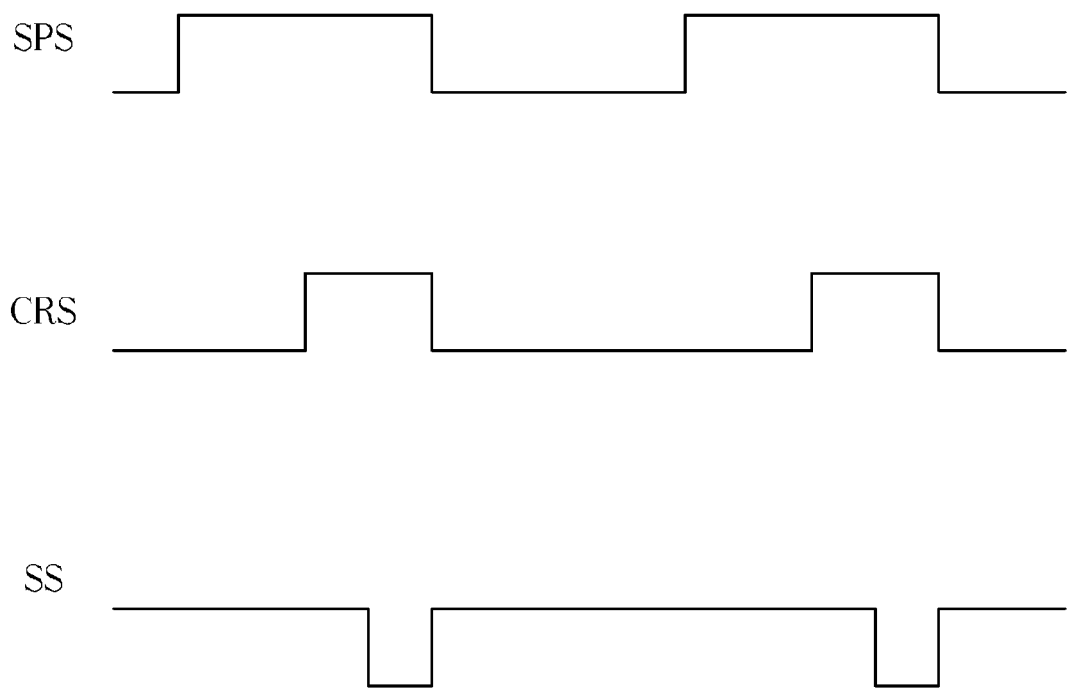
FIG. 1 discloses schematic diagram of a prior art temperature sensing method
Figure 2:
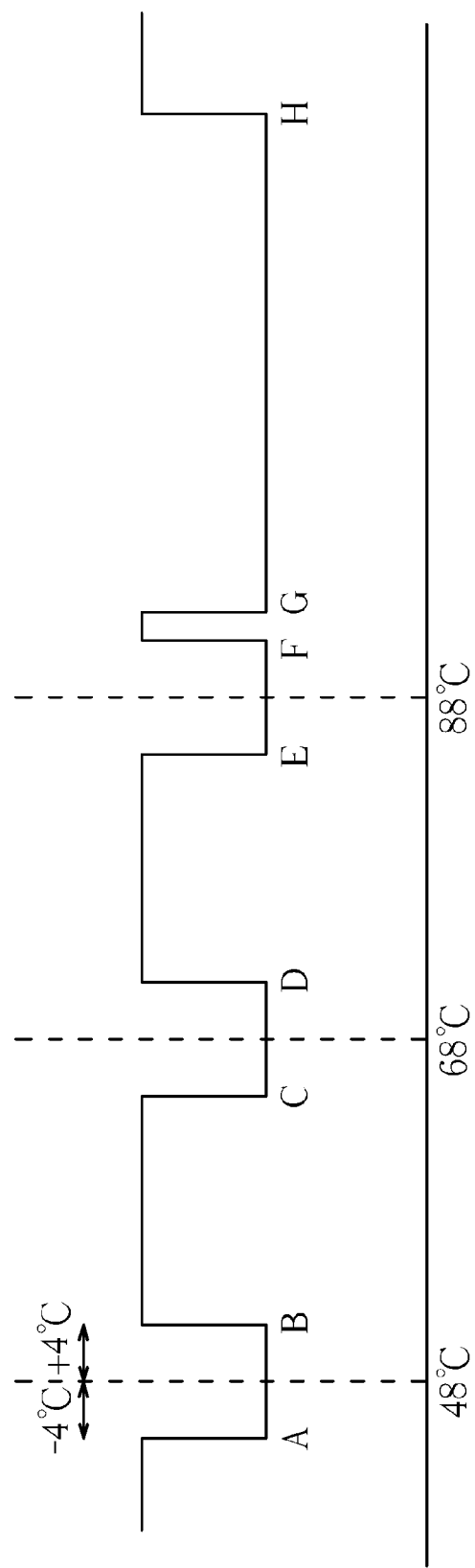
FIG. 2 is a schematic diagram illustrating the concept of the temperature sensing operations according to embodiments of the present application.

FIG. 2 is a schematic diagram illustrating one of the concepts of the temperature sensing operations according to embodiments of the present application. The concept disclosed in FIG. 2 indicates: change the temperature sensing time interval between each of the temperature sensing operations according to whether the sensed temperature falls in a predetermined range of a specific temperature or not. As shown in FIG. 2, points A, B, C, D, E, F, and G are transition points of the sampling preparing signal SPS, which indicate sampling points of the sampling preparing signal SPS (i.e. temperature sensing points). Also, the temperature sensing time interval between each transition points indicates temperature sensing time intervals between each temperature sensing operations, such as the temperature sensing time interval between points AB and the temperature sensing time interval between points BC.

In one embodiment, if the sensed temperature falls in a predetermined range of a specific temperature, temperature sensing time interval decreases. Otherwise, if the sensed temperature does not fall in a predetermined range of a specific temperature, temperature sensing time interval increases. For example, the predetermined range is set to +/−4° C., and the specific temperatures are 48° C., 68° C. and 88° C. Therefore, if the sensed temperature is 50° C., the temperature sensing temperature sensing time interval decreases to 64 us, and the temperature sensing temperature sensing time interval increases from 64 us to 128 us if the sensed temperature is 53° C. (the temperature sensing time interval between AB is shorter than the temperature sensing time interval between BC). Similarly, if the sensed temperature is 70° C., the temperature sensing temperature sensing time interval decreases, and the temperature sensing temperature sensing time interval increases if the sensed temperature is 73° C. (the temperature sensing time interval between CD is shorter than the temperature sensing time interval between BC and DE). The above mentioned temperatures 48° C., 68° C. and 88° C. are temperatures at which a DRAM refreshes, but do not mean to limit the scope of the present application. The longer the sensing operation period, the fewer power does the temperature consume. Therefore the power consumption can decrease via increasing temperature sensing operation temperature sensing time interval when the sensed temperature is not near important temperature points.

Alternatively, this embodiment can be regarded as: the control unit changes the temperature sensing time interval according to whether the specific temperature falls in a predetermined temperature range of the sensed temperature. For example, if the sensed temperature is above-mentioned 50° C., which falls in the +/−4° C. range of the specific temperature 48° C., and the predetermined temperature range is also +/−4° C. In this case, the specific temperature 48° C. falls in the predetermined temperature range of the sensed temperature 50° C. Another example, the sensed temperate is 40° C., which does not fall in the +/−4° C. range of the specific temperature 50° C. In this case, the specific temperature 48° C. does not fall in the predetermined temperature range +/−4° C. of the sensed temperate 40° C. Accordingly, determining whether the sensed temperature falls in a range of the specific temperature or not, or determining whether the specific temperature falls in a range of the sensed temperature or not can reach the same function.

Another embodiment of the present invention discloses: the temperature sensing time interval changes if variation of the sensed temperatures from the last times of temperature sensing operations occurs. For more detail, if the sensed temperatures from the final n times of temperature detecting operations are all the same, it means the temperature is stable such that the temperature sensing time interval between the temperature sensing operations increases to decrease power consumption. Besides, the temperature sensing time interval between the temperature sensing operations decreases once the sensed temperature changes. For example, if the sensed temperatures from the final n times are all 45° C., the temperature sensing time interval increases from 64 us to 128 us, and if the sensed temperature keeps stable, the temperature sensing time interval increases from 128 us to 256 us. On the other hand, if the sensed temperature changes, the temperature sensing time interval decreases from 256 us to 128 us. Also, the temperature sensing time interval decreases from 128 us to 64 us if the sensed temperature changes again.

It should be noted that the above mentioned values of temperature sensing time intervals are only for example and do not mean to limit the scope of the present invention.

Figure 3:
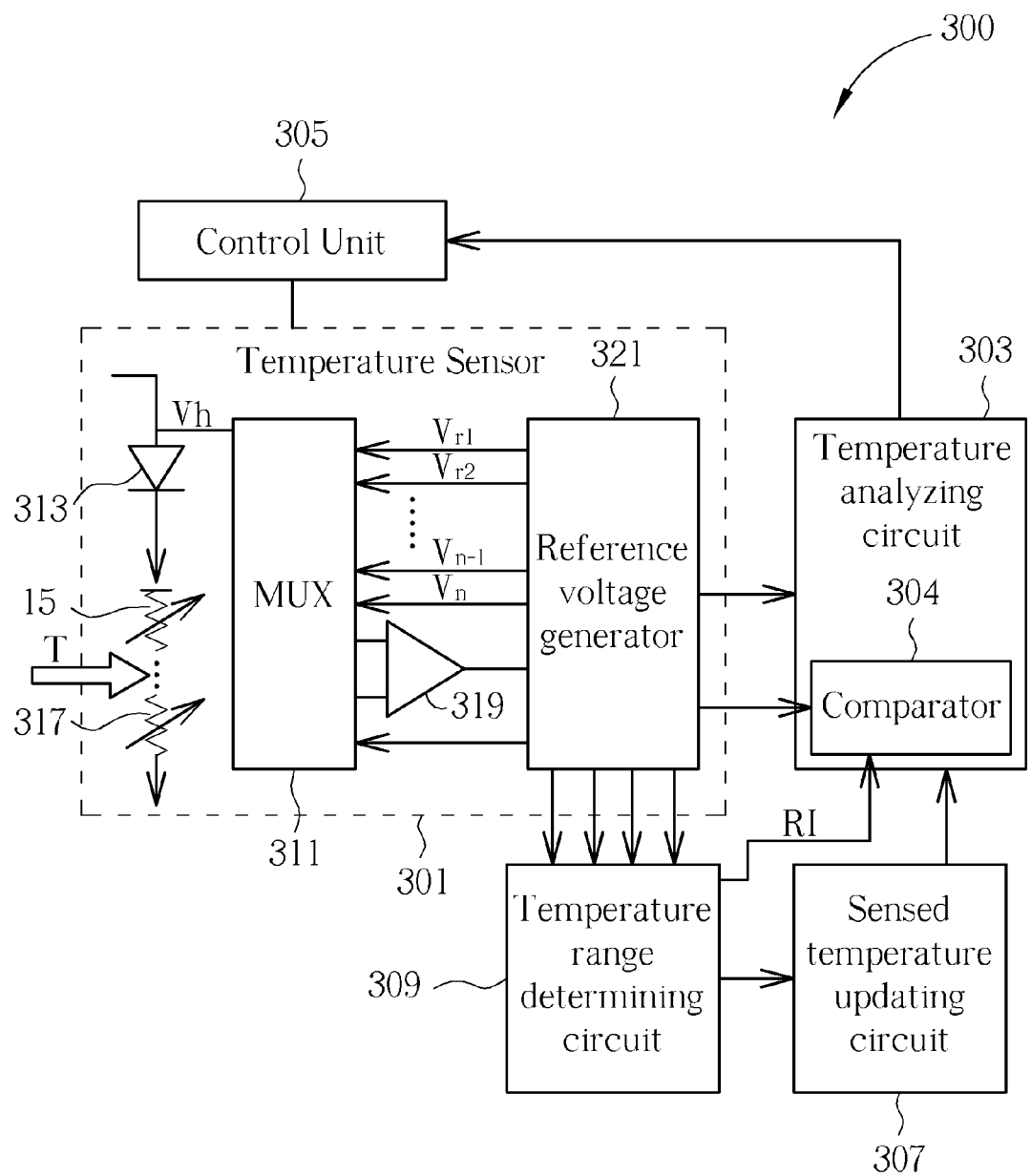
FIG. 3 is a block diagram illustrating a temperature sensing system according to embodiments of the present application.

FIG. 3 is a block diagram illustrating a temperature sensing system 300 according to embodiments of the present application. The temperature sensing system 300 includes a temperature sensor 301, a temperature analyzing circuit 303, a control unit 305, and a sensed temperature updating circuit 307. The temperature sensor 301 performs temperature sensing operations to a target apparatus not shown in this figure to receive a sensed temperature T. The temperature analyzing circuit 303 determines the sensed temperature falls in a predetermined range of a specific temperature. The temperature analyzing circuit 303 can include a comparator 304 to compares the sensed temperature and a range information RI to determine which range does the sensed temperature falls in.

The control unit 305 controls a temperature sensing time interval between each of the temperature sensing operations. The control unit 305 changes the temperature sensing time interval between each of the temperature sensing operation according to at least one of following conditions: whether the sensed temperature falls in a predetermined range of a specific temperature or not according to the analyzing result of the temperature analyzing circuit 303, and whether the sensed temperatures from the last times of temperature sensing operations change or not.

In this embodiment, the temperature sensing system 300 includes a multiplexer 311, a diode 313, thermistors 315, 317 (only two of them are drafted), a comparator 319 and a reference voltage generator 321. Since the resistance of the thermistors 315, 317, the voltage $V_h$ will vary corresponding to different temperatures. The comparator 319 compares the voltage $V_h$ and one of the reference voltages $V_{r1}, V_{r2} \ldots V_{rn}$ to determine whether the voltage $V_h$ and the selected reference voltage are the same or not. If the comparing result indicates that the voltage $V_h$ and the selected reference voltage are not the same, a new reference voltage is selected. Such steps will repeat until the voltage $V_h$ and the selected reference voltage are the same, thereby the temperature can be sensed.

The embodiment shown in FIG. 3 can further include a temperature range determining circuit 309, which can decide the temperature ranges according to the reference voltages from the reference voltage generator 321.

Figure 4:
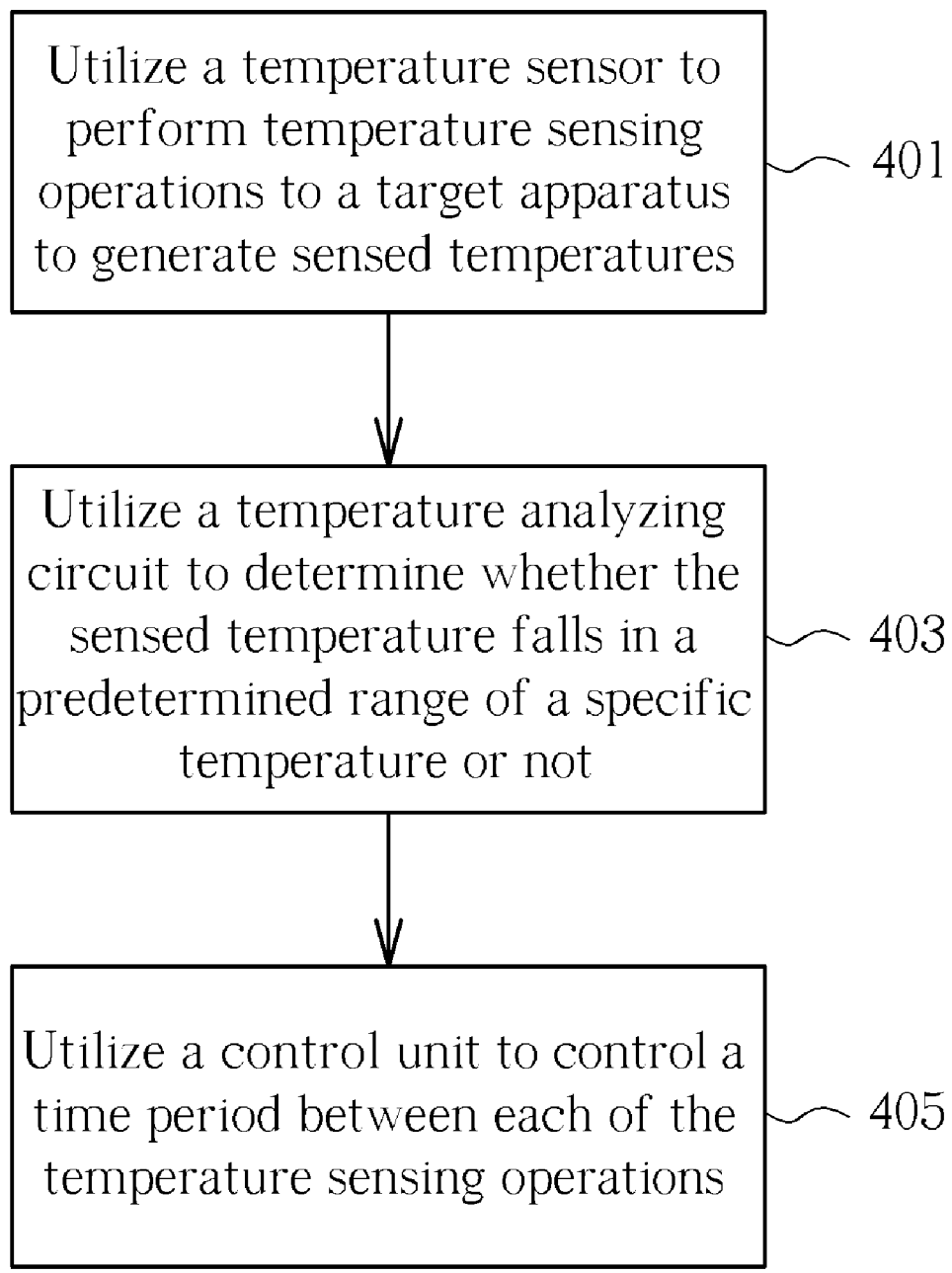
FIG. 4 is a flow chart diagram illustrating a temperature sensing method according to embodiments of the present application.

FIG. 4 is a flow chart diagram illustrating a temperature sensing method according to embodiments of the present application. The method includes:

Step 401

Utilize a temperature sensor to perform temperature sensing operations to a target apparatus to generate sensed temperatures.

Step 403

Utilize a temperature analyzing circuit to determine whether the sensed temperature falls in a predetermined range of a specific temperature or not.

Step 405

Utilize a control unit to control a temperature sensing time interval between each of the temperature sensing operations.

The step 405 changes the temperature sensing time interval between each of the temperature sensing operation according to at least one of following conditions: whether the sensed temperature falls in the predetermined range of a specific temperature not according to the result of the step 403, and whether the sensed temperatures from the last times of temperature sensing operations change or not.

According to above mentioned description, the unnecessary temperature sensing operations can be avoided, such that the power consumption of the temperature sensor can decrease.

Those skilled in the art will readily observe that numerous modifications and alterations of the device and method may be made while retaining the teachings of the invention.

What is claimed is:

1. A temperature sensing system, comprising:
a temperature analyzing circuit, for sensing temperature of a target apparatus and generating an analyzing result in response to the sensed temperature; and
a control unit, for controlling a temperature sensing time interval;
wherein the control unit continuously changes the temperature sensing time interval according to if the sensed temperature falls in a predetermined temperature range of at least one specific temperature.

2. The temperature sensing system of claim 1, wherein the control unit changes the temperature sensing time interval according to whether the sensed temperatures from the last times of temperature sensing operations change or not.

3. The temperature sensing system of claim 2, wherein the control unit decreases the temperature sensing time interval when the sensed temperature for the last times of temperature sensing operations change.

4. The temperature sensing system of claim 1, further comprising a sensed temperature updating circuit for distinguishing whether a latest sensed temperature is updated or not.

5. The temperature sensing system of claim 1, wherein the target apparatus is a DRAM, and the specific temperatures are self refresh temperatures of the target apparatus.

6. The temperature sensing system of claim 1, wherein the control unit decreases the temperature sensing time interval when the specific temperature falls in the predetermined temperature range.

7. The temperature sensing system of claim 1, wherein the temperature analyzing circuit includes a comparator to compares the sensed temperature and range information to determine which range does the sensed temperature falls in.

8. A temperature sensing method, comprising:
   (a) utilizing a temperature analyzing circuit to sense temperature of a target apparatus and to generate an analyzing result in response to the sensed temperature; and
   (b) utilizing a control unit to control a temperature sensing time interval;
   wherein the step (b) continuously changes the temperature sensing time interval according to if the sensed temperature falls in a predetermined temperature range of at least one specific temperature.

9. The temperature sensing method of claim 8, wherein the step (b) changes the temperature sensing time interval according to whether the sensed temperatures from the last times of temperature sensing operations change or not.

10. The temperature sensing method of claim 9, wherein the step (b) decreases the temperature sensing time interval when the sensed temperature for the last times of temperature sensing operations change.

11. The temperature sensing method of claim 8, further comprising utilizing a sensed temperature updating circuit to distinguish whether a latest sensed temperature is updated or not.

12. The temperature sensing method of claim 8, wherein the target apparatus is a DRAM, and the specific temperatures are self refresh temperatures of the target apparatus.

13. The temperature sensing method of claim 8, wherein the step (b) decreases the temperature sensing time interval when the specific temperature falls in the predetermined temperature range.

14. The temperature sensing method of claim 8, wherein the temperature analyzing circuit includes a comparator to compares the sensed temperature and range information to determine which range does the sensed temperature falls in.

15. A temperature sensing system, comprising:
   a temperature analyzing circuit, for sensing temperature of a target apparatus and generating an analyzing result in response to the sensed temperature; and
   a control unit, for controlling a temperature sensing time interval;
   wherein the control unit continuously changes the temperature sensing time interval according to whether the sensed temperatures from the last times of temperature sensing operations change or not.

16. A temperature sensing method, comprising:
   (a) utilizing a temperature analyzing circuit to sense temperature of a target apparatus and to generate an analyzing result in response to the sensed temperature; and
   (b) utilizing a control unit to control a temperature sensing time interval;
   wherein the step (b) continuously changes the temperature sensing time interval according to whether the sensed temperatures from the last times of temperature sensing operations change or not.

* * * * *